(12) United States Patent
Aiura et al.

(10) Patent No.: US 9,768,039 B2
(45) Date of Patent: Sep. 19, 2017

(54) SUBSTRATE PROCESSING APPARATUS

(71) Applicant: Tokyo Electron Limited, Tokyo (JP)

(72) Inventors: Kazuhiro Aiura, Koshi (JP); Norihiro Ito, Koshi (JP); Hidetoshi Nakao, Beaverton, OR (US); Kazuyoshi Shinohara, Koshi (JP); Satoru Tanaka, Koshi (JP); Yuki Yoshida, Koshi (JP); Meitoku Aibara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 709 days.

(21) Appl. No.: 14/084,839

(22) Filed: Nov. 20, 2013

(65) Prior Publication Data

US 2014/0137902 A1    May 22, 2014

(30) Foreign Application Priority Data

Nov. 21, 2012 (JP) .................................. 2012-255566
Sep. 30, 2013 (JP) .................................. 2013-205418

(51) Int. Cl.
H01L 21/67    (2006.01)
H01L 21/687    (2006.01)

(52) U.S. Cl.
CPC .. H01L 21/67051 (2013.01); H01L 21/68735 (2013.01)

(58) Field of Classification Search
CPC ................... H01L 21/67051; H01L 21/68735
USPC .......................................................... 134/95.2
See application file for complete search history.

(56) References Cited

U.S. PATENT DOCUMENTS

| 5,439,519 | A | * | 8/1995 | Sago | ....................... B05C 11/08 118/501 |
| 8,539,906 | B2 | | 9/2013 | Ogata et al. | |
| 2004/0180141 | A1 | * | 9/2004 | Kobayashi | ............. B05D 1/005 427/240 |
| 2008/0280054 | A1 | * | 11/2008 | Ogata | ............... H01L 21/67051 427/425 |
| 2012/0192899 | A1 | | 8/2012 | Higashijima | |

FOREIGN PATENT DOCUMENTS

JP    2012-129462 A    7/2012

* cited by examiner

*Primary Examiner* — Michael Barr
*Assistant Examiner* — Tinsae Ayalew
(74) *Attorney, Agent, or Firm* — Pearne & Gordon LLP

(57) ABSTRACT

A substrate processing apparatus includes a rotary cup that is provided at a substrate holding unit to surround a substrate held thereon and to be rotated along with the substrate holding unit, and configured to guide a processing liquid dispersed from the substrate; and an outer cup that is provided around the rotary cup with a gap therebetween and configured to collect the guided processing liquid by the rotary cup. Further, a height of an upper end of the rotary cup is higher than that of the outer cup. Furthermore, an outward protrusion protruded outwards in a radial direction thereof and extended along a circumference thereof is provided at an upper end portion of an outer surface of the rotary cup, and the outward protrusion blocks mist of the processing liquid dispersed from the gap between the rotary cup and the outer cup toward a space above the substrate.

9 Claims, 6 Drawing Sheets

SUBSTRATE PROCESSING APPARATUS

CROSS-REFERENCE TO RELATED APPLICATION

This application claims the benefit of Japanese Patent Application Nos. 2012-255566 and 2013-205418 filed on Nov. 21, 2012, and Sep. 30, 2013, respectively, the entire disclosures of which are incorporated herein by reference.

TECHNICAL FIELD

The embodiments described herein pertain generally to a technique for suppressing mist of a processing liquid dispersed from a substrate from adhering to the substrate in a substrate processing apparatus configured to perform a liquid process on the substrate by using the processing liquid.

BACKGROUND

One of processes for manufacturing a semiconductor device is a liquid process (for example, a cleaning process) which is performed by supplying a processing liquid (for example, a chemical liquid) onto a substrate such as a semiconductor wafer (hereinafter, simply referred to as "wafer"). As an apparatus configured to perform such a liquid process, there is known a single-substrate processing apparatus that holds a substrate (wafer) by a spin chuck and supplies a processing liquid onto a surface of the wafer while rotating the wafer.

The processing liquid supplied to the wafer may be dispersed from the wafer being rotated in the form of mist. In order to collect the dispersed mist, a structure called a "cup" configured to surround the wafer W is provided. One example of such a cup is described in Patent Document 1. A substrate processing apparatus described in Patent Document 1 includes a rotary cup configured to be rotated while being connected to a spin chuck; and a stationary cup provided at an outside of the rotary cup in a radial direction thereof. The mist dispersed from the wafer may be guided into the rotary cup and introduced into a flow path formed within the stationary cup. In order to avoid interference between the rotary cup that is rotated and a first cup (stationary cup) that is not rotated, a gap of an appropriate size needs to be provided therebetween.

A part of the processing liquid introduced into the flow path of the stationary cup has been already turned into the form of mist before reaching the flow path, or turns into the form of mist as a result of colliding with a wall surface of the flow path. The mist may adhere to the wafer after flowing backward through the gap between an outer surface of the rotary cup and an inner surface of the first cup. The mist adhering to the wafer may cause particle generation. In order to suppress this problem, a returning member is provided at the inner surface of the first cup. When an air current is generated in the gap between the rotary cup and the first cup in a circumferential direction of the cup at the time when the rotary cup is rotated, the returning member guides the air current downwards. Accordingly, backflow of the mist to the wafer through the gap between the rotary cup and the first cup can be greatly reduced.

With the above-described configuration, however, the flowing of the mist of the processing liquid toward the wafer through the gap cannot be suppressed perfectly. In this aspect, the description of Patent Document 1 still leaves a room for improvement.

Patent Document 1: Japanese Patent Laid-open Publication No. 2012-129462

SUMMARY

In view of the foregoing, an example embodiment provides an improved cup unit structure capable of suppressing mist of a processing liquid dispersed from a substrate from adhering to the substrate.

In one example embodiment, a substrate processing apparatus includes a substrate holding unit configured to hold thereon a substrate horizontally; a rotation driving unit configured to rotate the substrate holding unit about a vertical axis line; a processing liquid nozzle configured to supply a processing liquid for performing a liquid process onto the substrate; a rotary cup that is provided at the substrate holding unit to surround the substrate held on the substrate holding unit and to be rotated along with the substrate holding unit, and is configured to guide the processing liquid dispersed from the substrate that is rotating; and an outer cup that is provided around the rotary cup with a gap therebetween and is configured to collect the guided processing liquid by the rotary cup. Further, a height of an upper end of the rotary cup is higher than a height of an upper end of the outer cup. Furthermore, an outward protrusion protruded outwards in a radial direction of the rotary cup and extended along a circumference of the rotary cup is provided at an upper end portion of an outer surface of the rotary cup. Moreover, the outward protrusion is configured to block mist of the processing liquid dispersed from the gap between the rotary cup and the outer cup toward a space above the substrate held on the substrate holding unit.

In accordance with the example embodiment, since the height of the rotary cup is set to be higher than the height of the upper end of the outer cup, the processing liquid dispersed outwards from the substrate can be suppressed from crossing over the upper end of the rotary cup and adhering to the outer cup. Further, even if some of the mist of the processing liquid is dispersed toward the substrate through the gap between the rotary cup and the outer cup, the mist can be blocked by the outward protrusion. Accordingly, the processing liquid that has dripped after adhering to the outer cup can be suppressed from being dispersed toward the substrate through the gap between the rotary cup and the outer cup after bouncing off the rotary cup being rotated. Therefore, it is possible to suppress the mist from adhering to the substrate.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
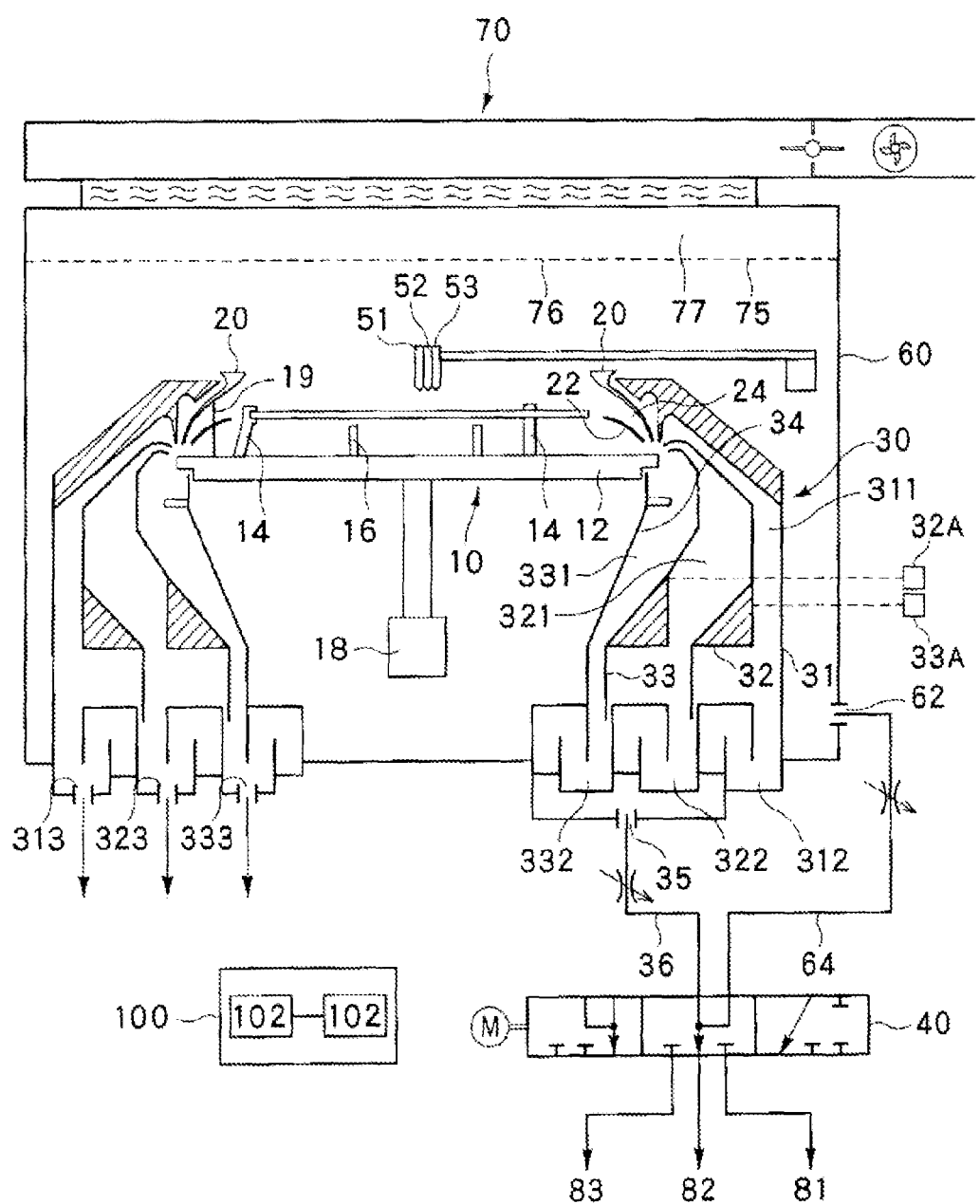
FIG. 1 is a schematic diagram illustrating a configuration of a substrate processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments will be described with reference to the accompanying drawings. As depicted in FIG. 1, a substrate processing apparatus includes a substrate holding unit 10 configured to hold thereon a semiconductor wafer (hereinafter, simply referred to as "wafer") W horizontally. The substrate holding unit 10 includes a circular plate-shaped base 12; and a multiple number of, e.g., three chuck claws 14 fastened to the base 12. The substrate holding unit 10 serves as a mechanical spin chuck configured to hold the wafer W at a multiple number of positions on peripheral portions thereof by the chuck claws 14. The base 12 includes a non-illustrated plate having lift pins 16 configured to lift the wafer W while supporting a rear surface thereof when the wafer W is transferred between an external transfer arm and the base 12. The substrate holding unit 10 can be rotated by a rotation driving unit 18 having an electric motor, so that the wafer W held on the substrate holding unit 10 can also be rotated about a vertical axis line.

An outer rotary cup 20 and an inner rotary cup 22, which have a circular ring shape, are fastened to the base 12 of the substrate holding unit 10 via three supporting columns 19 (only one of them is shown in FIG. 1). A flow path 24 is formed between the outer rotary cup 20 and the inner rotary cup 22, and an atmosphere above the wafer W is introduced into a cup unit 30 through the flow path 24. A processing liquid scattered off and dispersed from the wafer W after supplied to the wafer W being rotated is received by the inner surface of the outer rotary cup 20 and guided into the cup unit 30 along the inner surface of the outer rotary cup 20. The inner rotary cup 22 is configured to suppress a fluid including the processing liquid flowing through the flow path 24 from flowing to a rear surface of the wafer W. Further, the inner rotary cup 22 also serves to guide an air current, which is generated in a space between the base 12 and the rear surface of the wafer W when the substrate holding unit 10 is rotated, into the cup unit 30.

The cup unit 30 includes a stationary first annular cup 31, i.e., an outer cup, located at an outermost position thereof; an annular second cup 32 provided at an inner position than the first cup 31 and configured to be movable up and down; an annular third cup 33 provided at an inner position than the second cup 32 and configured to be movable up and down; and a stationary inner wall 34 positioned at an inner position than the third cup 33. The second cup 32 and the third cup 33 are moved up and down by elevating devices 32A and 33A schematically illustrated in FIG. 1, respectively, and the first, second and third cups 31, 32 and 33 and the inner wall 34 are not rotated. A first flow path 311 is formed between the first cup 31 and the second cup 32; a second flow path 321 is formed between the second cup 32 and the third cup 33; and a third flow path 331 is formed between the third cup 33 and the inner wall 34.

A cup exhaust opening 35 communicating with the first, second and third flow paths 311, 321 and 331 is formed in a bottom of the cup unit 30. A cup exhaust path 36 is connected to the cup exhaust opening 35.

Each of the first, second and third flow paths 311, 321 and 331 has a bent portion. As a direction of each flow path is sharply changed at the bent portion, a liquid component is separated from a gas-liquid mixture fluid flowing in each flow path. The separated liquid component falls down into a liquid sump 312 corresponding to the first flow path 311, a liquid sump 322 corresponding to the second flow path 321 and a liquid sump 332 corresponding to the third flow path 331. The liquid sumps 312, 322 and 332 are connected to an acidic liquid waste system, an alkaline liquid waste system and a general liquid waste system (all of them are not illustrated) of a factory via liquid drain openings 313, 323 and 333 corresponding thereto, respectively.

The substrate processing apparatus is equipped with a multiple number of processing liquid nozzles configured to discharge (supply) processing liquids toward the wafer W held on and rotated by the substrate holding unit 10. In this example embodiment, an acidic chemical liquid nozzle 51 configured to discharge an acidic cleaning liquid (e.g., dilute hydrofluoric acid (DHF)), an alkaline chemical liquid nozzle 52 configured to discharge an alkaline cleaning liquid (e.g., SC-1) and a rinse liquid nozzle 53 configured to discharge a rinse liquid (e.g., DIW (pure water)) are provided. The respective processing liquids are supplied to the corresponding liquid nozzles from non-illustrated processing liquid supply devices connected to processing liquid supply sources, respectively. Each of processing liquid supply devices has a processing liquid supply path having an opening/closing valve and a flow rate controller such as a flow rate control valve.

The substrate holding unit 10 and the cup unit 30 are accommodated in a housing 60. A fan filter unit (FFU) 70 is provided at a ceiling of the housing 60.

A rectifying plate 75 having a multiple number of through holes 76 is provided under the ceiling of the housing 60. The rectifying plate 75 is configured to rectify clean air (CA) discharged downwards from the FFU 70 such that the clean air (CA) mainly flows on the wafer W. Within the housing 60, a downflow of the clean air is generated to flow downwards toward the wafer W from the through holes 76 of the rectifying plate 75.

A housing exhaust opening 62 configured to exhaust an atmosphere within the housing 60 is formed at a lower portion of the housing 60 (specifically, at a position lower than a top opening of the cup unit 30) to be located at an outside of the cup unit 30. A housing exhaust path 64 is connected to the housing exhaust opening 62.

The cup exhaust path 36 and the housing exhaust path 64 are selectively connected to an acidic atmosphere exhaust line 81, an alkaline atmosphere exhaust line 82 and a general atmosphere exhaust line 83 of a factory exhaust system depending on a position of a valve body of the switching valve 40. Since the respective exhaust lines 81 to 83 are set to be under a negative pressure, an atmosphere in the internal space of the cup unit 30 and an atmosphere in the internal space of the housing 60 are sucked up depending on the position of the valve body of the switching valve 40.

As schematically illustrated in FIG. 1, the substrate processing apparatus has a controller (control unit) 100 configured to control an overall operation thereof. That is, the controller 100 controls operations of all functional components of the substrate processing apparatus (for example, the rotation driving unit 18, the elevating devices 32A and 33A of the second and third cups 32 and 33, the non-illustrated processing liquid supply device, the switching valve 40, the FFU 70, the gas supply device 79B, etc.). By way of non-limiting example, the controller 100 may be implemented by a general-purpose computer as hardware and programs (including an apparatus control program, processing recipes, etc.) as software for operating the computer. The software may be stored in a storage medium such as a hard disk drive fixed in the computer, or may be stored in a storage medium detachably set in the computer, such as a CD-ROM, a DVD, a flash memory, etc. Such a storage medium is indicated by a reference numeral 101 in FIG. 1. A processor 102 reads out a necessary processing recipe from the storage medium 101 in responses to an instruction from a non-illustrated user interface and executes the processing recipe, so that each functional component of the substrate processing apparatus is operated under the control of the controller 100, and a preset process is performed.

Now, an operation of the substrate processing apparatus performed under the control of the controller 100 will be discussed.

(Acidic Chemical Liquid Cleaning Process)

A wafer W is held by the substrate holding unit 10 and is rotated by the rotation driving unit 18. As a processing liquid, an acidic chemical liquid, e.g., DHF is supplied onto the rotating wafer W from the acidic chemical liquid nozzle 51, and an acidic chemical liquid cleaning process is performed on the wafer W. The acidic chemical liquid is dispersed from the wafer W by a centrifugal force and received by the rotary cup 20. At this time, the second cup 32 and the third cup 33 are located at lowered positions, and the acidic chemical liquid flows through the first flow path 311 between the first cup 31 and the second cup 32.

At this time, the valve body of the switching valve 40 is located at a first position (a position shifted to the right from the position shown in FIG. 1). Accordingly, clean air that exists in the space above the wafer W may be introduced into the cup unit 30 mainly through the flow path 24 between the outer rotary cup 20 and the inner rotary cup 22. The clean air introduced into the cup unit 30 flows through the first flow path 311 and is exhausted from the cup exhaust opening 35. Then, the clean air flows into the acidic atmosphere exhaust line 81 through the cup exhaust path 36 and the switching valve 40.

Further, a part of the acidic chemical liquid is turned into the form of mist as a result of colliding with the wafer, the rotary cup 20, the first cup 31, etc. This mist is introduced into the cup unit 30, so that it flows toward the cup exhaust opening 35 by being carried on the gas flowing through the first flow path 311. Most of this mist may be captured by a wall of the bent portion of the first flow path 311 and fall down into the liquid sump 312. Further, the acidic chemical liquid that flows down along the surfaces of the first cup 31 and the second cup 32 facing the first flow path 311 may also fall down into the liquid sump 312. The acidic chemical liquid collected in the liquid sump 312 is discharged out of the cup unit 30 through the liquid drain opening 313.

Further, a gas that exists in a space around the cup unit 30 within the housing 60 may be exhausted from the housing exhaust opening 62 and flown into the acidic atmosphere exhaust line 81 via the housing exhaust path 64 and the switching valve 40.

(First Rinse Process)

Subsequently, while rotating the wafer W, the discharge of the acidic chemical liquid from the acidic chemical liquid nozzle 51 is stopped, and a rinse liquid, e.g., DIW is supplied onto the wafer W from the rinse liquid nozzle 53 as a processing liquid. As a result, the acidic chemical liquid and its residue remaining on the wafer W are cleaned. This rinse process is different from the acidic chemical liquid cleaning process only in this operation, and the other operations (flows of a gas and a processing liquid) are the same as those in the acidic chemical liquid cleaning process.

(Alkaline Chemical Liquid Cleaning Process)

Thereafter, while rotating the wafer W, the discharge of the rinse liquid from the rinse liquid nozzle 53 is stopped. Then, the third cup 33 remains at the lowered position, and the second cup 32 is moved to a raised position. Further, the valve body of the switching valve 40 is located at a second position (a position illustrated in FIG. 1). Subsequently, as a processing liquid, an alkaline cleaning liquid, e.g., SC-1 is supplied from the alkaline chemical liquid nozzle 52 onto the wafer W, so that an alkaline chemical liquid cleaning process is performed on the wafer W. This alkaline chemical liquid cleaning process is different from the acidic chemical liquid cleaning process in exhaust paths of a gas and the alkaline chemical liquid, and the other operations are the same as those of the acidic chemical liquid cleaning process.

That is, after a gas (clean air) in the space above the wafer W is introduced into the cup unit 30 through the top opening of the first cup 31, this gas flows through a second flow path 321 between the second cup 32 and the third cup 33. Then, the gas is exhausted from the cup exhaust opening 35 and flows into the alkaline atmosphere exhaust line 82 via the cup exhaust path 36 and the switching valve 40. The chemical liquid dispersed from the wafer W flows through the second flow path 321 and falls down into the liquid sump 322. Then, the chemical liquid is discharged out of the cup unit 30 through the liquid drain opening 323. Meanwhile, a gas that exists in the space around the cup unit 30 within the housing 60 is exhausted from the housing exhaust opening 62 and flows into the alkaline atmosphere exhaust line 82 via the housing exhaust path 64 and the switching valve 40.

(Second Rinse Process)

Thereafter, while rotating the wafer W, the discharge of the alkaline chemical liquid from the alkaline chemical liquid nozzle 52 is stopped, and the rinse liquid is supplied onto the wafer W from the rinse liquid nozzle 53 instead, so that the alkaline chemical liquid and its residue remaining on the wafer W are cleaned. This second rinse process is the same as the first rinse process excepting that the exhaust paths of a gas and the processing liquid (rinse liquid) are different from those in the first rinse process.

(Drying Process)

Then, while rotating the wafer W, the discharge of the rinse liquid from the rinse liquid nozzle 53 is stopped. The second cup 32 remains at the raised position, and the third cup 33 is moved to a raised position (this state is shown in FIG. 1). Further, the valve body of the switching valve 40 is located at a third position (a position shifted to the left from the position shown in FIG. 1). In this state, the rotation of the wafer W is continued for a preset period of time. As a result, DIW remaining on the wafer W is dispersed from the wafer W, so that the wafer W is dried.

Figure 3:
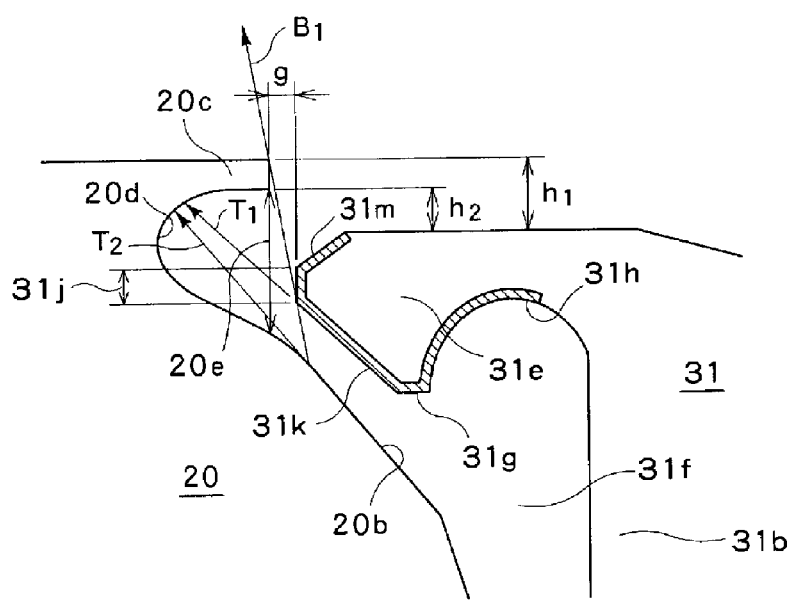
FIG. 3 is an enlarged cross sectional view of the rotary cup and the first cup shown in FIG. 2.
Figure 4:
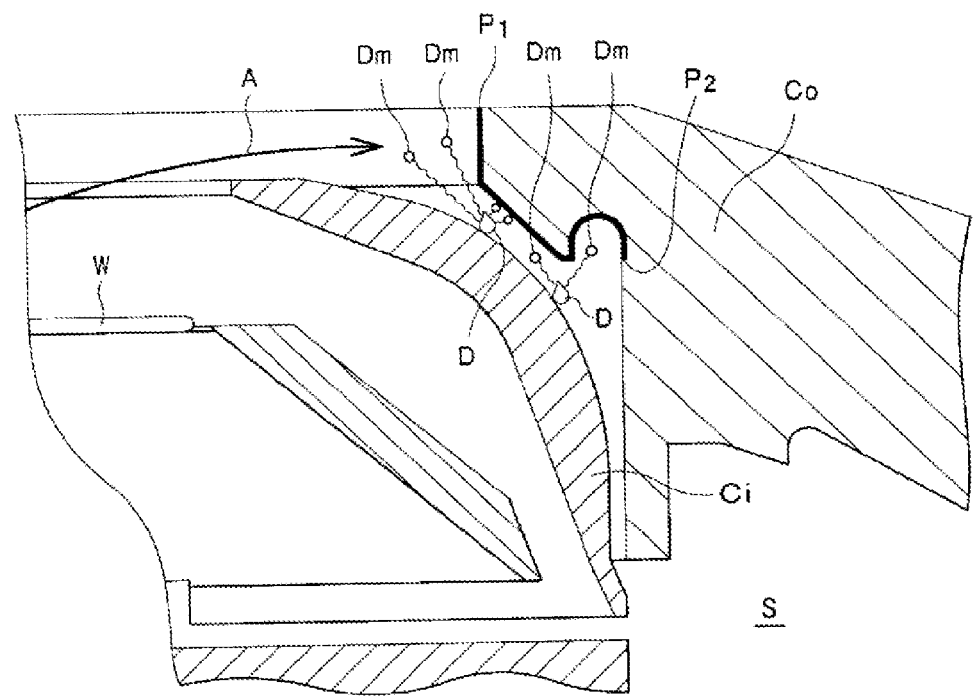
FIG. 4 is a cross sectional view illustrating a rotary cup and an outer cup in accordance with a comparative example embodiment, which corresponds to FIG. 2.

Subsequently, a structure related to suppressing a backflow of mist between the rotary cup 20 and the first cup (also described as the "rotary cup" and the "first cup" in BACKGROUND), as aforementioned in BACKGROUND, will be described with reference to FIG. 3 to FIG. 5. Further, FIG. 2 and FIG. 3 illustrate the example embodiment, whereas FIG. 4 illustrates a comparative example embodiment without having the inventive feature of the example embodiment.

Figure 2:
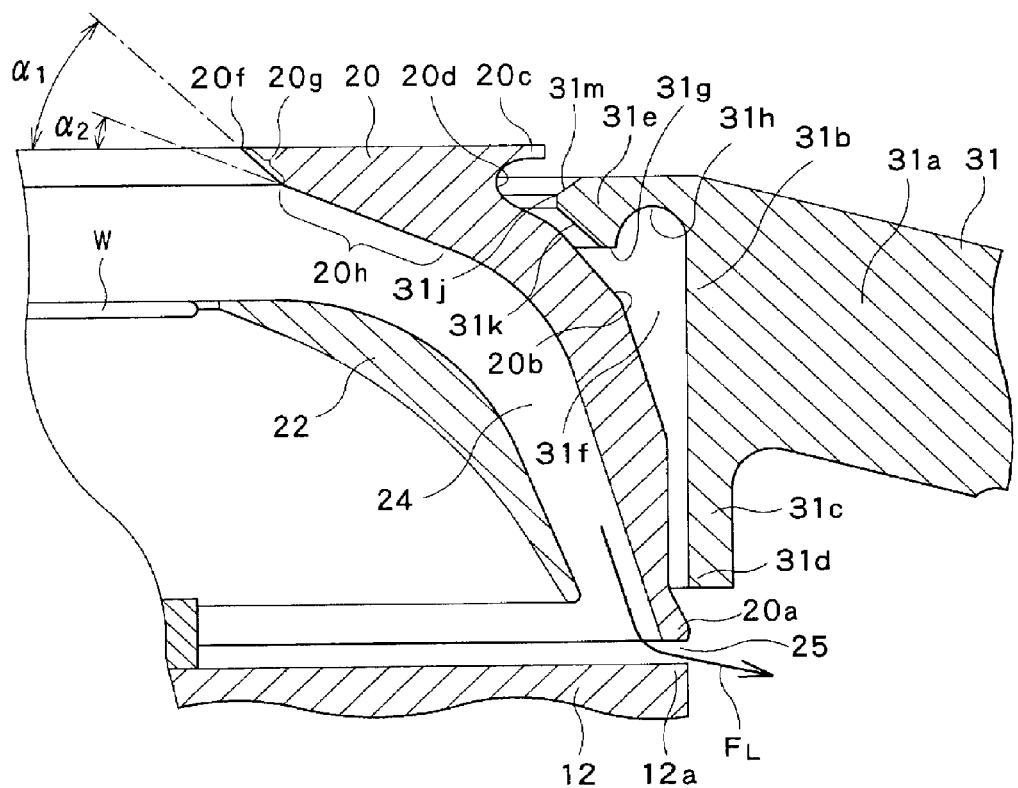
FIG. 2 is a cross sectional view illustrating a rotary cup and a first cup (outer cup)

As depicted in FIG. 2, the first cup 31 includes a first cup main body 31a; and a downward protrusion 31c extended downwards from an inner end 31b of the first cup main body 31a. A gap 25 is formed between an outer periphery 12a of the base 12 of the substrate holding unit 10 and a lower end 20a of the rotary cup 20. The processing liquid (a mixture fluid of the processing liquid and a gas) flowing into the flow path 24 by being dispersed from the top surface of the wafer W after supplied thereto is introduced into the internal space of the cup unit 30, specifically, one of the first, second and third flow paths 311, 321 and 331, from the gap 25 (depending on the positions of the second and third cups 32 and 33). A lower end 31d of the downward protrusion 31c is located at a position higher than the lower end 20a of the rotary cup 20. Accordingly, the downward protrusion 31c does not block a flow $F_L$ of the processing liquid that flows out from the gap 25. Further, since the inner periphery of the lower end 31d of the downward protrusion 31c is located at the substantially same position as the outer periphery of the lower end 20a of the rotary cup 20 in the radial direction thereof or located at a slightly inner position than that in the radial direction thereof, the processing liquid flowing out from the gap 25 would be hardly introduced into a gap between the downward protrusion 31c and the rotary cup 20 directly.

An inward protrusion 31e is extended from the inner end 31b of the first cup main body 31a inwardly in the radial direction thereof more than the downward protrusion 31c. A gas guiding space 31f is formed by the first cup main body 31a, the downward protrusion 31c, the inward protrusion 31e and the rotary cup 20. The surface of the first cup 31 facing the gas guiding space 31f is vertically extended upwards, starting from a position corresponding to the lower end 31d of the downward protrusion 31c. The surface of the first cup 31 is bent downwards at a recess 31h and vertically extended to a position corresponding to a lower end 31g of the inward protrusion 31e. The recess 31h forms a bottom surface of the inward protrusion 31e and is depressed in an upward direction and, desirably, has a U-shaped curved surface. The gas guiding space 31f is configured to guide downwards a gas revolved by the rotation of the rotary cup 20. That is, as the rotary cup 20 is rotated, the gas within the gas guiding space 31f is also revolved along the surface of the first cup 31 facing the gas guiding space 31f and is made to flow outwards due to a centrifugal force. The flow direction of this gas flow may be changed to an upward direction or a downward direction after the gas collides with the uprightly extended surface of the first cup 31 facing the gas guiding space 31f. However, the gas flow in the upward direction is hindered by the inward protrusion 31e and, thus, the gas can hardly flow upwards while passing through a gap between the rotary cup 20 and the inward protrusion 31e. Accordingly, when the rotary cup 20 is rotated, the gas within the gas guiding space 31f is guided downwards along the surface of the first cup 31 facing the gas guiding space 31f.

In addition to the gas flow generated within the gas guiding space 31f by the centrifugal force, the internal space (the first, second and third flow paths 311, 321 and 331) of the cup unit 30 may be set in a negative pressure. A gas may be introduced into a gap between the first cup 31 and the rotary cup 20 from a space thereabove, and the introduced gas may be flown out toward the internal space of the cup unit 30 from a gap between the lower end 31d of the downward protrusion 31c and the lower end 20a of the rotary cup 20. Due to this flow of the gas within the gap between the first cup 31 and the rotary cup 20, mist of the processing liquid once introduced into the internal space of the cup unit 30 can be suppressed from flowing backward in the gap toward the space above the wafer W to some extent.

It is apparent from the comparison of FIG. 2 and FIG. 4 that the example embodiment shown in FIG. 2 and the comparative example embodiment shown in FIG. 4 are substantially same. That is, a gas flow in the gap between the first cup 31 and the rotary cup 20 (in the comparative example embodiment, a gap between an outer cup Co that is not rotated and an inner cup Ci that is rotated) is found to be identical in the example embodiment of FIG. 2 and the comparative example embodiment of FIG. 4. In the comparative example embodiment depicted in FIG. 4, however, there is observed mist adhering to a top surface of a wafer W after dispersed toward a space above the wafer W from the gap between the outer cup Co and the inner cup Ci.

The present inventors have investigated the reason for this problem and found out that in the comparative example embodiment depicted in FIG. 4, a processing liquid adheres to a region indicated by a bold solid line between a point $P_1$ and a point $P_2$ on the surface of the outer cup Co (corresponding to the first cup 31). Further, it has been also found out that if the processing liquid adhering thereto falls down on an outer surface of the inner cup Ci (corresponding to an outer surface 20b of the rotary cup 20) as droplets D, the droplets D would bounce on the outer surface of the inner cup Ci to be dispersed in the form of mist Dm, and a part of the mist Dm flows toward the wafer W through the gap between the outer cup Co and the inner cup Ci.

Two cases where the processing liquid may adhere to the region between the point $P_1$ and the point $P_2$ are assumed as follows.

(1) The processing liquid scattered off and dispersed outwards from the wafer W may directly adhere to a surface (e.g., a vertical surface or an inclined surface near the point $P_2$) of the outer cup Co after crossing over the inner cup Ci (corresponding to the rotary cup 20) (as indicated by an arrow A in FIG. 4).

(2) The aforementioned gas flow generated in the gap between the outer cup Co and the inner cup Ci is relatively weak. Further, an internal space S of a cup unit typically set in a negative pressure may be temporarily turned into a positive pressure for some reason. As a result, mist in the internal space S may flow backward toward the gap between the outer cup Co and the inner cup Ci. The mist may adhere to a surface of the outer cup Co by being carried on an air current in a space, which corresponds to the gas guiding space 31f, between the outer cup Co and the inner cup Ci. When this phenomenon occurs, the mist may be directly discharged toward the space above the wafer, by being carried on the back flow.

In the present example embodiment, in order to suppress adhesion of the processing liquid in case (1), the height of the upper end of the rotary cup 20 is set to be higher than that of the upper end of the first cup 31 (refer to a height difference $h_1$ shown in FIG. 3), as illustrated in FIG. 2 and FIG. 3. Accordingly, it is possible to suppress the processing liquid scattered off from the wafer W and crossing over the rotary cup 20 from directly adhering to the first cup (a hatched portion in FIG. 3) that faces the outer surface of the rotary cup 20. Even if some of the mist adheres to the first cup, the amount of adhesion can be minimized.

It may be very difficult to suppress adhesion of the processing liquid in case (2). There may be a likelihood that some of the processing liquid may cross over the rotary cup 20 and adhere to an upper portion of the first cup 31, as mentioned above. In such a case, droplets of the processing liquid dripping from the first cup 31 may bounce on the outer surface of the rotary cup 20 and be dispersed in the form of mist. As a solution, in the example embodiment shown in FIG. 2 and FIG. 3, an outward protrusion 20c protruded outwards in a radial direction is formed at an upper end of the outer surface 20b of the rotary cup 20. The outward protrusion 20c is a ring-shaped portion continuously extended along the entire circumference of the rotary cup 20. The outward protrusion 20c is configured to block the mist that has dripped from the first cup 31 and flows toward the space above the wafer W after bounced on the outer surface of the rotary cup 20 (below, referred to as "blocking function"). Further, in the event that mist is discharged by being carried on a flow of a gas that flows backward in the gap between the first cup 31 and the rotary cup 20 when the internal space of the cup unit 30 is turned into a positive pressure as mentioned above, the flow direction of the gas may be changed by the outward protrusion 20c so that the gas may flow outwards in the radial direction of the wafer, without heading toward the space above the wafer W (below, referred to as "flow direction changing function").

Below, the outward protrusion 20c will be described in detail. It is desirable that a gap g between a leading end (outer periphery) of the outward protrusion 20c and a leading end (inner periphery 31j) of the inward protrusion 31e of the first cup 31 in the radial direction is set to be of a negative value. In such a case, the outer periphery of the outward protrusion 20c is located at an outer position than that shown in FIG. 3 in the radial direction, and the leading end of the outward protrusion 20c and the leading end of the inward protrusion 31e of the first cup 31 are overlapped. That is, the outward protrusion 20c is protruded outwards more than an upper portion (in this example embodiment, the inner periphery 31j) of the first cup 31 located at the innermost position in the radial direction. Accordingly, mist flowing toward the space above the wafer W as indicated by an arrow $B_1$ in FIG. 3 can be surely blocked by the outward protrusion 20c. Thus, the probability of dispersion and flowing of mist to the space above the wafer W can be completely eliminated.

If, however, the rotary cup 20 is manufactured as a single-piece component, the gap g needs to be set to be of a positive value as shown in FIG. 3 in order to provide the rotary cup 20 at the inside of the first cup 31. In such a case, there remains likelihood that the mist bounced off the outer surface 20b of the rotary cup 20 moves toward the space above the wafer W as indicated by the arrow $B_1$ in FIG. 3. However, if the gap g is set to be of a very small value, e.g., about 2 mm or less, desirably, about 1 mm or less, such a probability may be reduced and become negligible, because the height of the upper end of the rotary cup 20 is higher than the height of the upper end of the first cup 31. Further, in order to set the gap g to 0 (zero) or a negative value as stated above, for example, the rotary cup 20 may be formed as a dual structure including a part corresponding to the outward protrusion 20c and the rest part. In such a case, after the rotary cup 20 is provided at the inside of the first cup 31, the outward protrusion 20c may be fastened to the rotary cup 20.

Even if the gap is not 0 (zero) but has a positive value, the above blocking function can be sufficiently exerted only if an extension line (a tangent line) $T_1$ of a surface portion (corresponding to a surface 31k to be described later) of the inward protrusion 31e of the first cup 31, which is inclined to become closer to the wafer W as it goes upwards, and an extension line (tangent line) $T_2$ of an outer surface portion of the rotary cup 20, which is positioned in the vicinity of the outward protrusion 20c and inclined to become closer to the wafer W as it goes upwards, are set to intersect the outward protrusion 20c.

Moreover, a recess 20d extended in the circumferential direction and depressed inwards in the radial direction is formed between the bottom surface of the outward protrusion 20c and an upper end portion (i.e., in the vicinity of the outward protrusion 20c) of the inclined surface portion of the outer surface 20b of the rotary cup 20 that is inclined inwards in the radial direction as it goes upwards. Desirably, the recess 20d may be formed to have a U-shaped curved surface when viewed in its cross section. By forming such a recess 20d, when the internal space of the cup unit 30 is turned into a positive value, the flow direction of the mist discharged by being carried on back flow of the gas in the gap between the first cup 31 and the rotary cup 20 can be changed along a surface of the recess 20d, and the mist can be guided away from the wafer W.

Furthermore, desirably, the height of an upper end of the inward protrusion 31e may be set to be lower than the height of an outer periphery of the bottom surface of the outward protrusion 20c (see a height difference $h_2$ in FIG. 3). With this configuration, even if mist discharged after flowing backward between the first cup 31 and the rotary cup 20 adheres to the first cup 31, particularly, to the inward protrusion 31e, the mist can be suppressed from dripping onto and bouncing off the rotary cup 20.

Further, the height of the inner periphery 31j of the inward protrusion 31e is within a range 20e from a bottom of the leading end (outer periphery) of the outward protrusion 20c to a position where a vertical line passing through the bottom of the leading end of the outward protrusion 20c intersects the outer surface 20b of the rotary cup 20. Further, the inward protrusion 31e has the surface 31k and a surface 31m with the inner periphery 31j therebetween. The surface 31k is inclined to become closer to the wafer W as it goes toward the lower portion of the inner periphery 31j, and the surface 31m is inclined to be distanced farther from the wafer W as it goes toward the upper portion of the inner periphery 31j. With this configuration, a gas is allowed to flow smoothly in a space surrounded by the surface of the recess 20d and the surfaces around the inner periphery 31j of the inward protrusion 31e. Accordingly, the mist discharged by being carried on the back flow of the gas in the gap between the first cup 31 and the rotary cup 20 can be more smoothly guided away from the wafer W when the internal space of the cup unit 30 becomes to be in the positive pressure.

Further, as illustrated in FIG. 4 as the comparative example embodiment, if an upper inner periphery of the inner cup Ci is formed to have a vertical surface, a processing liquid dispersed from the wafer W may adhere to the vertical surface and drip therefrom as droplets, so that the wafer W is contaminated. In contrast, in the example embodiment illustrated in FIG. 2, since an upper inner periphery 20f of the rotary cup 20 is formed to have an edge shape, the processing liquid may flow along this upper inner periphery of the rotary cup 20 after colliding with it. Thus, it is possible to suppress the processing liquid from dripping at this portion. Further, the inner surface of the rotary cup 20 has a first region 20g extended from the upper inner periphery 20f as a top end of the inner surface of the rotary cup 20 to a first height position lower than the upper inner periphery 20f; and a second region 20h extended from the first height position to a second height position lower than the first height position. The first and second regions 20g and 20h are inclined downwards to be outwardly oriented in the radial direction as it goes downwards. Further, an angle α1 formed by the first region 20g with respect to a horizontal plane is larger than an angle α2 formed by the second region 20h with respect to the horizontal plane. Since the angle α2 of the second region 20h is set to be relatively small, the processing liquid dispersed from the wafer W can be allowed to be directed outwards in the radial direction without bounding toward the wafer W even when the processing liquid collides with the second region 20h. Further, since the angle α1 of the first region 20g is set to be larger than the angle α2 of the second region 20h, a size of the opening of the rotary cup 20 can be increased as compared to a case where the angle α1 and the angle α2 are same (i.e., a case where the first region 20g is formed by extending the second region 20h straightly). Thus, a greater amount of air current can be introduced into the rotary cup 20. Further, since the first region 20g is located at a sufficiently higher position than the wafer W, the processing liquid dispersed from the wafer W may not flow back toward the wafer W after bouncing off the first region 20g.

However, as stated above, mist of a chemical liquid can reach the space surrounded by the rotary cup (outer rotary cup) 20 and the first cup 31. Depending on the kind of the chemical liquid used, the chemical liquid may be dried and crystallized to adhere to the inner surface of the first cup 31 facing the rotary cup 20 or the outer surface of the rotary cup 20 facing the first cup 31. If crystals grow thereat, at least one of the rotary cup 20 and the first cup 31 configured to be rotated relatively with respect to each other may be damaged. For this reason, it may be desirable to perform a cleaning process of the facing surfaces of the rotary cup 20 and the first cup 31 regularly depending on the kind of the chemical liquid.

Figure 5:
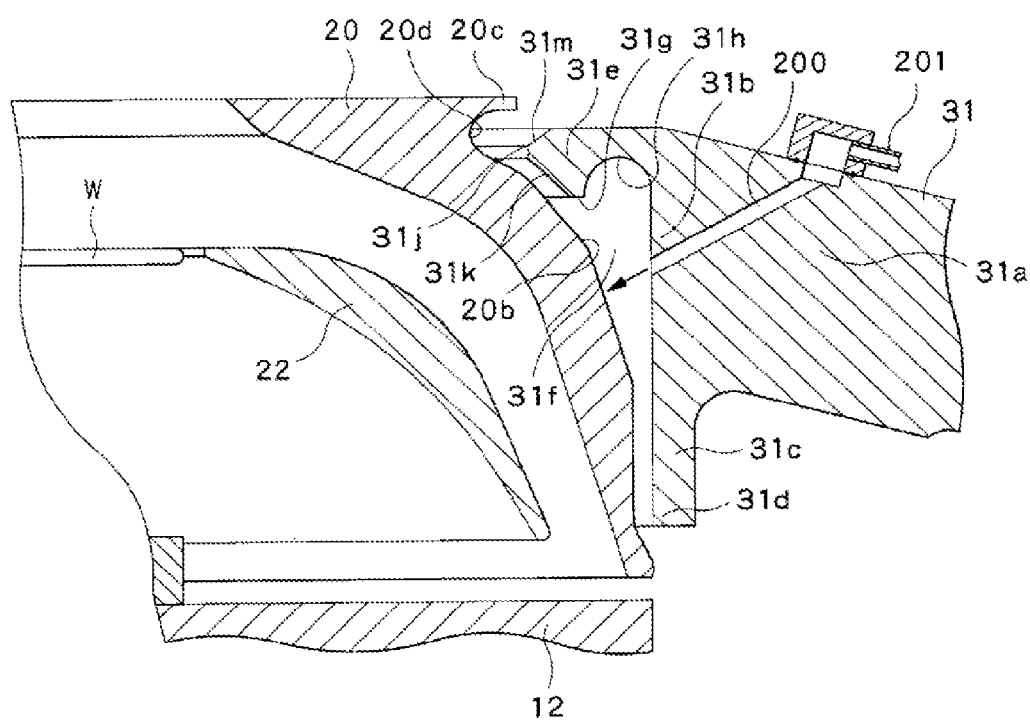
FIG. 5 is a cross sectional view illustrating a unit to clean facing surfaces of the rotary cup and the first cup.

A unit to perform such a cleaning process is illustrated in FIG. 5. One or more cleaning liquid flow paths 200 (cleaning liquid supplying unit) is formed in the first cup 31. The cleaning liquid flow path 200 is extended through the first cup 31 from the top surface thereof and opened to the gas guiding space 31f. A cleaning liquid such as DIW is supplied into the cleaning liquid flow path 200 from the outside of the first cup 31 via a cleaning liquid supplying line 201. Here, only one cleaning liquid flow path 200 may be provided. Alternatively, when a multiple number of cleaning liquid flow paths 200 are provided, the cleaning liquid flow paths 200 may be formed at a regular interval therebetween.

The width of the space between the rotary cup 20 and the first cup 31 is narrowed at both ends of the gas guiding space 31f, i.e., near the downward protrusion 31c and the inward protrusion 31e. Accordingly, leakage of the cleaning liquid from an upper end and a lower end (especially, the lower end) of the gas guiding space 31f may be suppressed. Thus, if the cleaning liquid is supplied continuously into the gas guiding space 31f from the cleaning liquid flow path 200 at a flow rate equal to or higher than a certain level, at least the gas guiding space 31f among the space between the rotary cup 20 and the first cup 31 can be filled with the cleaning liquid along the entire circumference thereof. If the supplying flow rate of the cleaning liquid from the cleaning liquid flow path 200 is further increased, it may be even possible to increase a liquid level of the cleaning liquid up to the vicinity of the outward protrusion 20c of the rotary cup 20.

If the rotary cup 20 is rotated in the state where the space between the rotary cup 20 and the first cup 31 is filled with the cleaning liquid, a revolving flow of the cleaning liquid may be generated in this space between the rotary cup 20 and the first cup 31. Accordingly, the facing surfaces of the rotary cup 20 and the first cup 31 can be cleaned efficiently.

Figure 6:
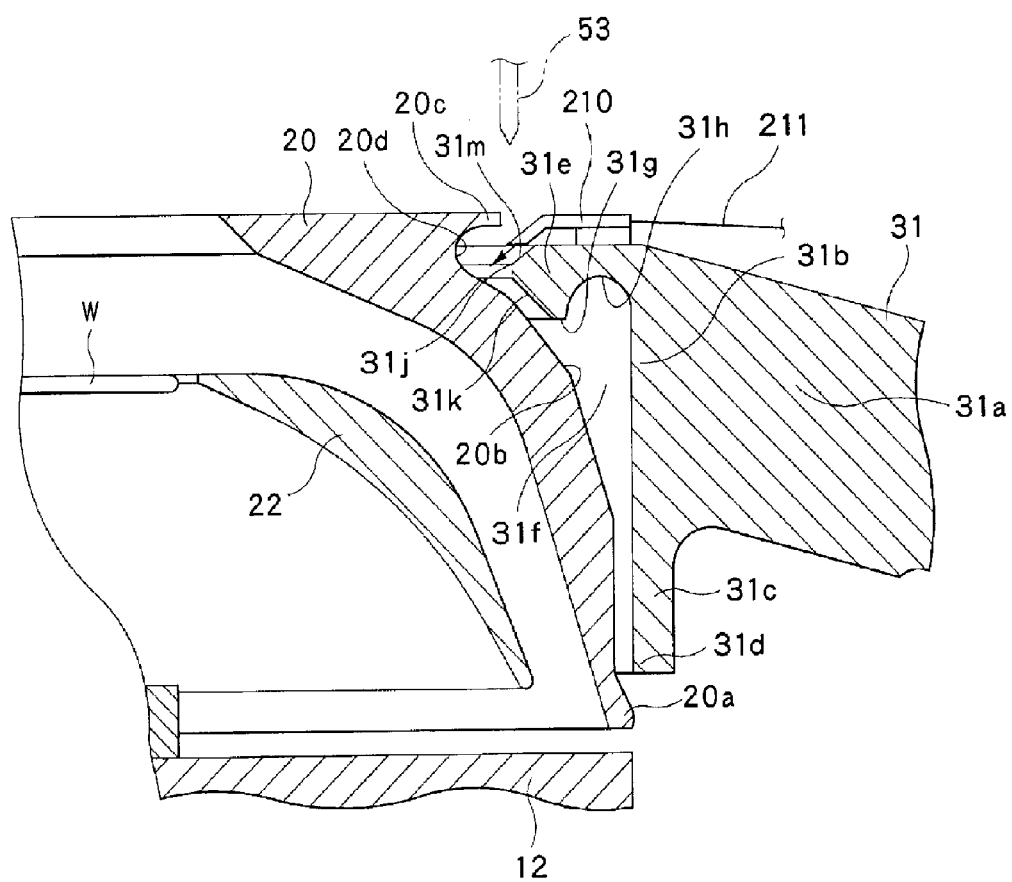
FIG. 6 is a cross sectional view illustrating another unit to clean the facing surfaces of the rotary cup and the first cup.

As depicted in FIG. 6, it may be also possible to provide an exclusive cleaning liquid nozzle 210 (cleaning liquid supplying unit) configured to clean the rotary cup 20 and the first cup 31. This cleaning liquid nozzle 210 is provided to discharge a cleaning liquid such as DIW supplied from a cleaning liquid supplying line 211 toward a gap between the upper ends of the rotary cup 20 and the first cup 31. By discharging the cleaning liquid from the cleaning liquid nozzle 210, the cleaning liquid is allowed to flow down along the outer surface of the rotary cup 20. Thus, at least the outer surface of the rotary cup 20 can be cleaned. Further, by rotating the rotary cup 20, the outer surface of the rotary cup 20 can be cleaned along the entire circumference thereof.

When performing the cleaning process by using the cleaning liquid nozzle 210, a rotation speed of the rotary cup 20 may be varied. By varying the rotation speed, the state of the cleaning liquid flowing down along the rotary cup 20 and the state of the cleaning liquid dispersed from the rotary cup 20 toward the first cup 31 due to a centrifugal force may be changed. Accordingly, the outer surface of the rotary cup 20 and the inner surface of the first cup 31 can be more uniformly cleaned. Further, the rotational direction of the rotary cup 20 may also be altered during the cleaning process, so that the outer surface of the rotary cup 20 and the inner surface of the first cup 31 can be cleaned more uniformly. By way of example, even if there is a region that cannot be cleaned by being rotated in one direction, that region may be cleaned by being rotated in a direction opposite to the one direction.

Still alternatively, the rinse liquid nozzle 53 (see FIG. 1) as a cleaning liquid supplying unit may be located at a position directly above the gap between the upper end of the rotary cup 20 and the upper end of the first cup 31, and a rinse liquid, such as DIW, as a cleaning liquid may be discharged from the rinse liquid nozzle 53. In this state, by rotating the rotary cup 20, the cleaning process can be performed.

Further, the configuration of FIG. 6 may be added to the configuration of FIG. 5. In this way, by configuring the cleaning liquid nozzle 210 to clean an upper end region of the space between the rotary cup 20 and the first cup 31, it is possible not to increase the supplying flow rate of the cleaning liquid from the cleaning liquid flow path 200.

Figure 7A:
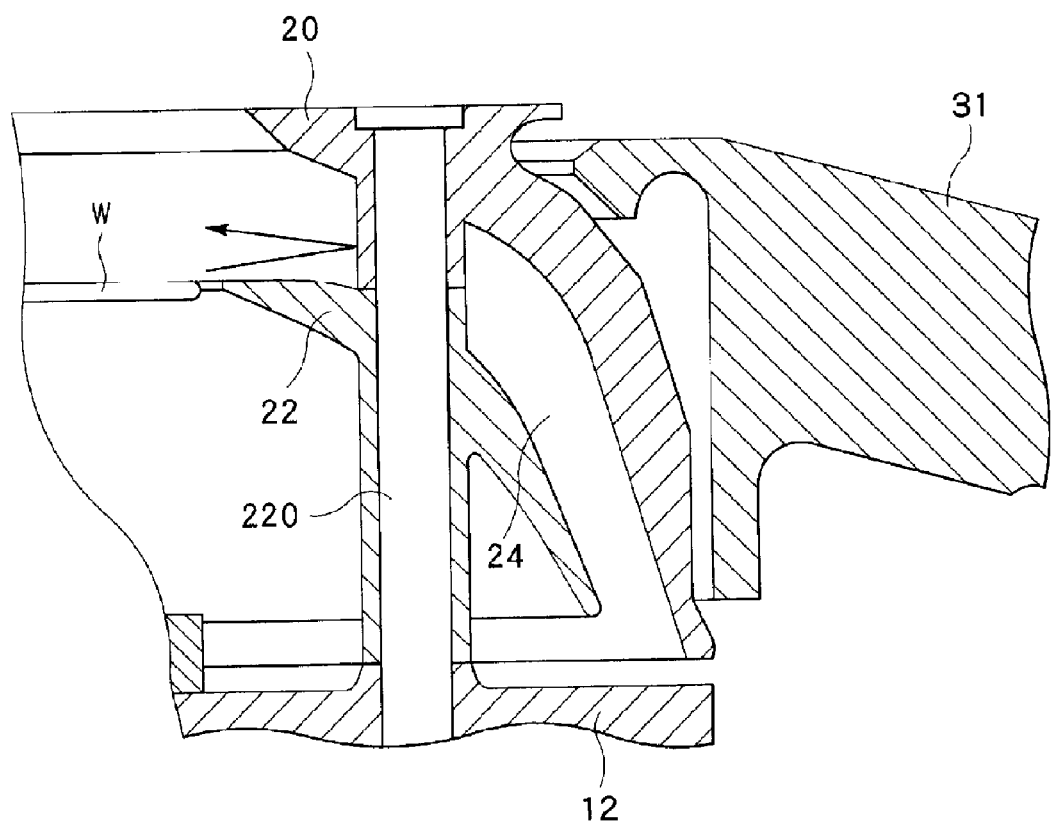
FIG. 7A and FIG. 7B are cross sectional views for describing the ways to fasten the rotary cup and the first cup to a base.
Figure 7B:
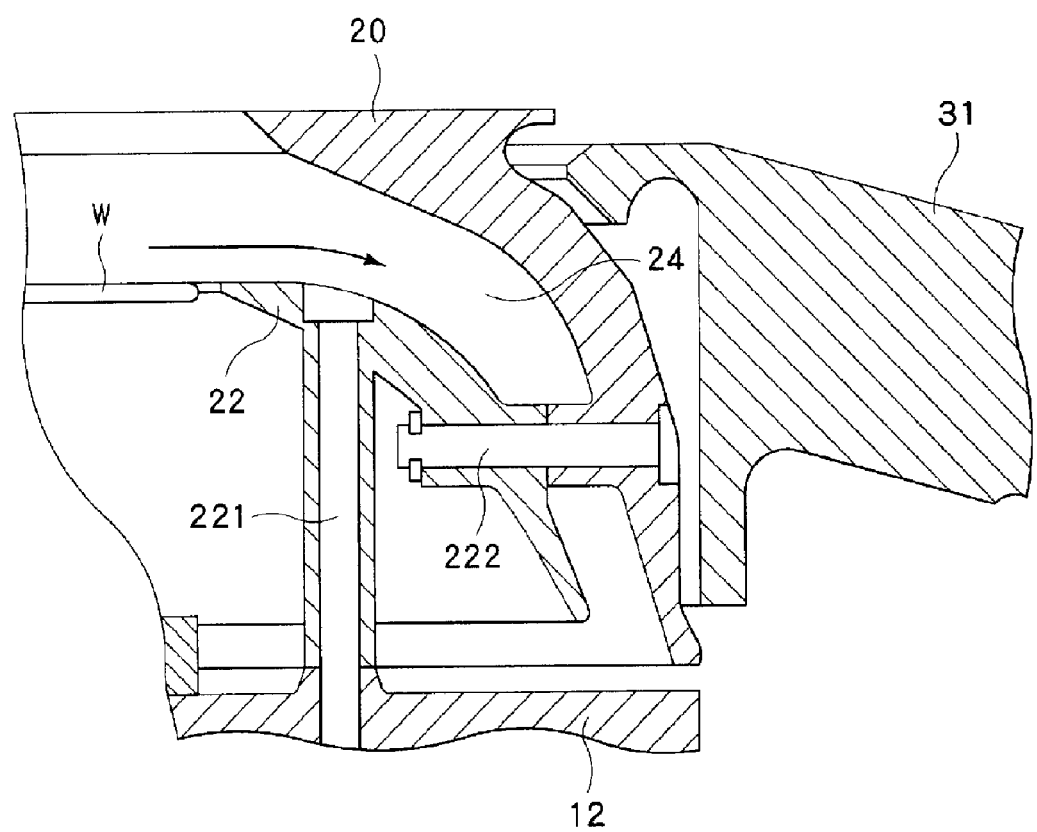

Now, referring to FIG. 7A and FIG. 7B, appropriate ways to fasten the outer rotary cup 20 and the inner rotary cup 22 to the base 12 of the substrate holding unit 10 will be explained. FIG. 7A and FIG. 7B illustrate the same cross sections as FIG. 2 but are viewed from different angular positions.

As depicted in FIG. 7A, in case that a supporting column 220 (corresponding to the supporting column 19 schematically illustrated in FIG. 1) having one end fastened to the base 12 is vertically extended through both the outer rotary cup 20 and the inner rotary cup 22, a part of the supporting column 220 may be located at a height position higher than the wafer W. In such a case, a part of a processing liquid dispersed from the wafer W due to a centrifugal force after supplied to the wafer W may collide with a part of the outer rotary cup 20 that enclose the supporting column 220 and bounce toward the wafer W (as indicated by an arrow in the figure). Since this bouncing toward the wafer W may cause particle generation, it is desirable to suppress this bouncing.

In this regard, as depicted in FIG. 7B, a supporting column 221 having one end fastened to the base 12 is provided to fasten only the inner rotary cup 22 to the base 12. The outer rotary cup 20 is fastened to the inner rotary cup 22 by another supporting column 222 extended in a horizontal direction (radial direction). With this configuration, the supporting column 222 can be provided at a height position lower than the wafer W. Accordingly, the processing liquid dispersed from the wafer W due to the centrifugal force after supplied thereto can be completely or greatly suppressed from colliding with the supporting column 221 (or 222) or the part of the rotary cup (20 or 22) enclosing the supporting column and from bounding off toward the wafer W.

Furthermore, in the example embodiment shown in FIG. 1, a device capable of reducing the humidity of clean air supplied from the FFU 70 may also be provided. By way of example, but not limitation, this device may be implemented by an air cooler and an air heater (both are not shown) provided at a downstream side of the damper within the FFU 70 in this sequence from the upstream side. By condensing and removing moisture in the air by the air cooler, and then, setting the temperature of the air to a required temperature (e.g., a room temperature) by the air heater, low-humidity clean air of a required temperature can be supplied from the FFU 70. Further, by controlling the switching valve, the atmosphere within the housing may be exhausted when performing the liquid process on the wafer by supplying the processing liquid onto the wafer from the processing liquid nozzle. Furthermore, by controlling the switching valve, the exhaust of the atmosphere within the housing may be stopped when performing the drying process on the wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus, comprising:
a substrate holding unit configured to hold thereon a substrate horizontally;
a rotation driving unit configured to rotate the substrate holding unit about a vertical axis line;
a processing liquid nozzle configured to supply a processing liquid for performing a liquid process onto the substrate;
a rotary cup that is provided at the substrate holding unit to surround the substrate held on the substrate holding unit and to be rotated along with the substrate holding unit, and is configured to guide the processing liquid dispersed from the substrate that is rotating; and
an outer cup that is provided around the rotary cup with a gap therebetween and is configured to collect the processing liquid guided by the rotary cup,
wherein a height of an upper end of the rotary cup is higher than a height of an upper end of the outer cup,
an outward protrusion protruded outwards in a radial direction of the rotary cup and extended along a circumference of the rotary cup is provided at an upper end portion of an outer surface of the rotary cup,
the outward protrusion is configured to block mist of the processing liquid dispersed from the gap between the rotary cup and the outer cup toward a space above the substrate held on the substrate holding unit,
an inward protrusion protruded inwards in a radial direction of the outer cup and extended along a circumference of the outer cup is provided at an upper end portion of an inner surface of the outer cup facing the outer surface of the rotary cup, and
a tangent line of a surface portion of the inward protrusion which is inclined to become closer to the substrate as it goes upwards is set to intersect a bottom surface of the outward protrusion of the rotary cup, and
wherein an inner surface of the rotary cup includes a first region extending from an uppermost end of the inner surface of the rotary cup to a first height position lower than the uppermost end of the inner surface of the rotary cup and a second region extending from the first height position to a second height position lower than the first height position,
the first region and the second region are inclined downwards to be outwardly inclined in the radial direction as they go downwards, and
a first angle formed by the first region with respect to a horizontal plane is larger than a second angle formed by the second region with respect to the horizontal plane, wherein the first angle is between 0° and 90° and the second angle is between 0° and 90°.

2. The substrate processing apparatus of claim 1,
wherein a gap between the outer surface of the rotary cup and the inner surface of the outer cup is narrowed at a vicinity of a position where the inward protrusion is provided, and
a recess depressed upwards is formed in a bottom surface of the inward protrusion.

3. The substrate processing apparatus of claim 1,
wherein an upper portion of the outer surface of the rotary cup has an inclined surface that is inclined upwards to be inwardly oriented in the radial direction as it goes upwards, and
a recess depressed inwardly in the radial direction and extended along the circumference of the rotary cup is formed between an upper end portion of the inclined surface and a bottom surface of the outward protrusion.

4. The substrate processing apparatus of claim 3,
wherein the recess of the rotary cup has a curved surface.

5. The substrate processing apparatus of claim 2,
wherein a height of an upper end of the inward protrusion is lower than a height of an outer periphery of a bottom surface of the outward protrusion.

6. The substrate processing apparatus of claim 3,
wherein a lower portion of an inner surface of the inward protrusion is inclined to become closer to the substrate as it goes upwards, and
an upper portion of the inner surface of the inward protrusion is inclined to become closer to the substrate as it goes downwards.

7. The substrate processing apparatus of claim 1,
wherein the outward protrusion of the rotary cup is protruded outwards in the radial direction more than an upper portion of the outer cup located at an innermost position in the radial direction.

8. The substrate processing apparatus of claim 1, further comprising:
a cleaning liquid supplying unit configured to supply a cleaning liquid into a space between the rotary cup and the outer cup,
wherein the cleaning liquid supplying unit includes at least one cleaning liquid flow path formed within the outer cup, and the at least one cleaning liquid flow path is extended through the outer cup and opened to the space between the rotary cup and the outer cup.

9. The substrate processing apparatus of claim 1, further comprising:
a housing configured to accommodate therein the substrate holding unit, the rotary cup and the outer cup; and
an exhaust controller configured to control an exhaust of an atmosphere within the housing,
wherein the exhaust controller exhausts the atmosphere within the housing when performing the liquid process on the substrate by supplying the processing liquid onto the substrate from the processing liquid nozzle, and stops the exhaust of the atmosphere within the housing when performing a drying process on the substrate.

* * * * *